United States Patent
Wakimoto et al.

(10) Patent No.: US 7,227,915 B2
(45) Date of Patent: Jun. 5, 2007

(54) RECEIVER AND AGC METHOD

(75) Inventors: Hiroshi Wakimoto, Saitama (JP);
Tsuyoshi Saka, Saitama (JP); Hideaki Furukawa, Saitama (JP)

(73) Assignee: Pioneer Corporation, Tokyo (JP)

( * ) Notice: Subject to any disclaimer, the term of this patent is extended or adjusted under 35 U.S.C. 154(b) by 770 days.

(21) Appl. No.: 10/647,113

(22) Filed: Aug. 25, 2003

(65) Prior Publication Data
US 2004/0071237 A1    Apr. 15, 2004

(30) Foreign Application Priority Data
Aug. 23, 2002 (JP) ............................... 2002-243565

(51) Int. Cl.
H04L 27/08 (2006.01)

(52) U.S. Cl. ................ 375/345; 455/234.1; 455/245.2; 348/528; 348/555

(58) Field of Classification Search ................ 375/345, 375/316; 348/528, 555, 731, 554; 455/234.1, 455/241.1, 245.1, 245.2, 253.2
See application file for complete search history.

(56) References Cited

U.S. PATENT DOCUMENTS 3,728,633 A * 4/1973 Krebs ........................ 455/138
6,219,108 B1 * 4/2001 LeRoy ....................... 348/724
6,522,870 B1 * 2/2003 Tinaphong et al. ...... 455/234.1
6,757,029 B2 * 6/2004 Kurihara ..................... 348/731
7,016,435 B2 * 3/2006 Adachi ........................ 375/345
7,117,514 B2 * 10/2006 Han ............................. 725/25

* cited by examiner

Primary Examiner—Phuong Phu
(74) Attorney, Agent, or Firm—Nixon & Vanderhyne, PC

(57) ABSTRACT

A receiver receives a multiplex broadcasting wave of a terrestrial wave and a satellite wave and executes AGC. As for the terrestrial wave, only a frequency band of the terrestrial wave is extracted by a filter for the terrestrial wave, and the AGC on the terrestrial wave side is executed through an AGC loop for the terrestrial wave. As for the satellite wave, the frequency band including the terrestrial wave and the satellite wave is extracted by the filter for the satellite wave, and the AGC is executed based on the signal. As a result, the AGC on the satellite wave side is affected by a receiving condition variation of the terrestrial wave. By a frequency-analysis of the terrestrial wave signal, the receiving condition of the terrestrial wave is analyzed. According to the analyzed result, an AGC adjusting quantity on the satellite wave side is determined and the AGC on the satellite wave side is adjusted by the adjusting quantity. Thereby, the effects on the satellite wave side by the receiving condition of the terrestrial wave signal may be reduced or eliminated, and appropriate AGC can be executed to the satellite wave.

6 Claims, 10 Drawing Sheets (NEAR RANGE FROM TERRESTRIAL WAVE ANTENNA)

PB1: FILTER PASS BAND FOR TERRESTRIAL WAVE
PB2: FILTER PASS BAND FOR SATELLITE WAVE (MIDDLE RANGE FROM TERRESTRIAL WAVE ANTENNA)

(FAR RANGE FROM TERRESTRIAL WAVE ANTENNA)

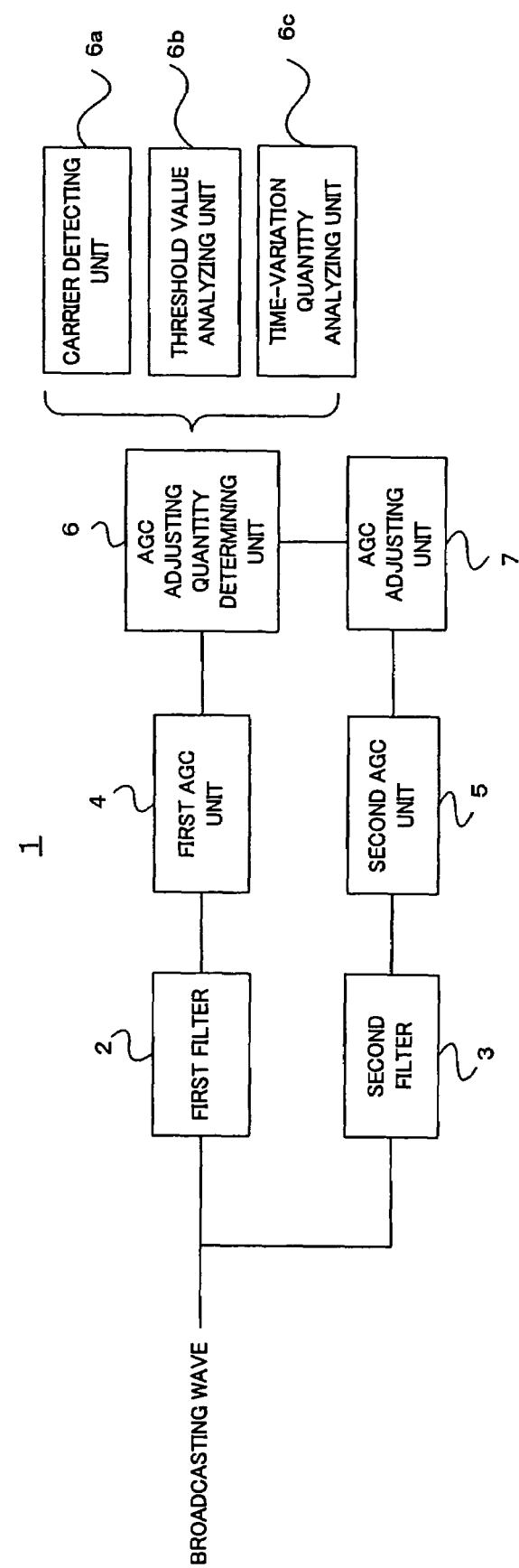

RECEIVER AND AGC METHOD

BACKGROUND OF THE INVENTION

1. Field of the Invention

The present invention relates to receiving technique of digital multiplex broadcasting.

2. Description of Related Art

As to satellite broadcasting for a movable body, a terrestrial wave is transmitted by means of a terrestrial wave repeater for a satellite wave interpolation, in addition to a satellite wave transmitted from a satellite. In this case, a TDM (Time Division Multiplexing) signal is utilized for the satellite wave. On the other hand, since the terrestrial wave requires a multiplex system, the multiplex systems such as an OFDM (Orthogonal Frequency Divisional Modulation) and a CDM (Code Division Multiplexing) are utilized for the terrestrial wave. As a result, both the satellite wave and the terrestrial wave of which systems are different are mixed, and a receiver receives a multiplex signal of a satellite wave and a terrestrial wave.

Generally, a receiver includes an AGC (Auto Gain Control) circuit which controls gain of a received signal, and such a receiver that receives the multiplex wave is formed to separately execute an AGC for each of broadcasting systems. Namely, the receiver separately executes the AGC to the broadcasting wave by a terrestrial wave digital broadcasting (hereafter it is called "terrestrial wave") and the broadcasting wave by a satellite broadcasting (hereafter it is called "satellite wave") through separate AGC circuits. Specifically, the receiver separately detects a signal level of each system from the multiplex signal, generates the AGC signal and separately executes the AGC. Accordingly, the receiver demodulates the received signal of each system, mixes both signals and supplies them to a decoder.

FIG. 1A shows frequency bands of the satellite wave and the terrestrial wave. Generally, the satellite wave is located neighboring to the terrestrial wave on a frequency axis in many cases. An example in FIG. 1A is the case of a certain system, in which the satellite waves are located neighboring on both sides of the terrestrial wave on the frequency axis. As for the terrestrial wave, the receiver extracts only terrestrial wave signals through a filter for the terrestrial wave which has a pass frequency band PB1 corresponding to a terrestrial wave frequency band. On the other hand, as to the satellite wave, if filters which each frequency band of the satellite wave passes through are separately prepared, a cost of the whole receiver will increase because the filters for plural frequency bands are needed. Thus, as shown in FIG. 1A, it is common that the filter for the satellite wave having a pass frequency band PB2 which the frequency band including both the terrestrial wave and the satellite wave can pass through are utilized in order to cut down the cost of a front-end of the receiver.

Since the satellite wave is transmitted from an artificial satellite, its electric field strength is small and the satellite wave is received at a roughly constant level. On the contrary, the electric field strength of the terrestrial wave is considerably varied in accordance with a range from a transmitting antenna to a receiving point. FIGS. 1A to 1C show varying examples of a received signal spectrum according to the range from the terrestrial wave antenna. As shown in FIG. 1A, a terrestrial wave component level of the multiplex wave which is received at a near range from the terrestrial wave antenna is large. However, as shown in FIG. 1B, the terrestrial wave component level of the multiplex wave which is received at a middle range from the terrestrial wave antenna is not so large. As shown in FIG. 1C, the terrestrial wave component level of the multiplex wave which is received at a far range from the terrestrial wave antenna is very small. Like those, though the signal level of the satellite wave is comparatively stable, the signal level of the terrestrial wave varies considerably dependently on the range from the transmitting antenna. Further, as to the terrestrial wave, effects of a fading and a multipath are also added to the signal level by surroundings. Accordingly, the signal level of the terrestrial wave is quite variable in comparison with that of the satellite wave.

As described above, in the case that a filter passing all frequency bands is utilized as the filter for the satellite wave as shown in FIG. 1A, an AGC circuit for the satellite wave executes the AGC based on the received signal in the frequency band including the terrestrial wave. Thereby, a problem described below can happen.

In the case of this example, since the satellite waves are located on both sides of the terrestrial wave, the terrestrial wave level is larger than the satellite wave level at the near range from the terrestrial wave antenna as shown in FIG. 1A. Therefore, in accordance with a large level of the terrestrial wave signal, the AGC circuit for the satellite wave executes the AGC in order not to generate a distortion of the level by a saturation of the terrestrial wave signal. Thus, the attenuation is also carried out to the satellite wave signals. As a result, the satellite wave which essentially needs to be received is also attenuated, and receiving the satellite wave may be difficult.

Also, as explained above, the terrestrial wave is easily affected by the fading and the multipath by the surroundings. Once the terrestrial wave level becomes unstable by the effects of the fading and the multipath, the AGC circuit for the satellite wave performs gain adjustment according to the variation. As a result, it sometimes happens that the level of the satellite wave cannot be controlled accurately.

SUMMARY OF THE INVENTION

The present invention has been achieved in order to solve the above problems, and its object is to eliminate the effect on AGC of a received signal from a received signal of different system, by adjusting the AGC amount for one received signal based on the receiving state of the other received signal.

According to one aspect of the present invention, there is provided a receiver including: a receiving unit which receives a multiplex wave of a first broadcasting wave and a second broadcasting wave and outputs a received signal; a first filter which extracts only the first broadcasting wave from the received signal and outputs a first broadcasting wave signal; a second filter which extracts the first broadcasting wave and the second broadcasting wave from the received signal and outputs a second broadcasting wave signal; a first AGC unit which controls a gain of the first broadcasting wave signal based on a level of the first broadcasting wave signal; a second AGC unit which controls a gain of the second broadcasting wave signal based on a level of the second broadcasting wave signal; an AGC adjusting quantity determining unit which analyzes a receiving condition of the first broadcasting wave signal and determines an AGC adjusting quantity based on an analyzed result; and an AGC adjusting unit which adjusts an AGC quantity of the second AGC unit according to the AGC adjusting quantity.

The AGC adjusting quantity determining unit may include: a carrier detecting unit which detects carriers of the first broadcasting wave signal; a threshold value analyzing unit which determines the receiving condition of the first broadcasting wave signal by comparing detected carriers with a predetermined threshold values; and a unit which determines the AGC adjusting quantity based on a determining result by the threshold value analyzing unit.

The threshold value analyzing unit may include: a unit which compares the detected carriers with the predetermined threshold value; a unit which compares a number of carriers having a level larger than the predetermined threshold value with a predetermined number; and a unit which executes an adjustment by the AGC adjusting unit in a case that the number of carriers having the level larger than the predetermined threshold value is smaller than the predetermined number.

The receiving condition of the broadcasting wave signal may include a condition associated with a range of the receiver from a broadcasting antenna for the first broadcasting wave signal and a condition of a fading.

The AGC adjusting quantity determining unit may include: a carrier detecting unit which detects carriers of the first broadcasting wave signal; a time-variation quantity analyzing unit which outputs a time-variation quantity indicating a level variation of the carrier during a predetermined time; and a unit which determines the AGC adjusting quantity in accordance with the time-variation quantity.

According to another aspect of the present invention, there is provided an AGC method including: a process of receiving a multiplex wave of a first broadcasting wave and a second broadcasting wave and outputting a received signal; a process of extracting only the first broadcasting wave from the received signal and outputting a first broadcasting wave signal; a process of extracting the first broadcasting wave and the second broadcasting wave from the received signal and outputting a second broadcasting wave signal; a first AGC process of controlling a gain of the first broadcasting wave signal based on a level of the first broadcasting wave signal; a second AGC process of controlling a gain of the second broadcasting wave signal based on a level of the second broadcasting wave signal; an AGC adjusting quantity determining process of analyzing a receiving condition of the first broadcasting wave signal and determining an AGC adjusting quantity based on an analyzed result; and an AGC adjusting process of adjusting an AGC quantity utilized in the second AGC process according to the AGC adjusting quantity.

The nature, utility, and further features of this invention will be more clearly apparent from the following detailed description with respect to preferred embodiment of the invention when read in conjunction with the accompanying drawings briefly described below.

BRIEF DESCRIPTION OF THE DRAWINGS

FIG. 2 is a diagram showing a schematic configuration of a receiver according to a preferred embodiment of the present invention.

DETAILED DESCRIPTION OF THE PREFERRED EMBODIMENTS

Figure 1A:
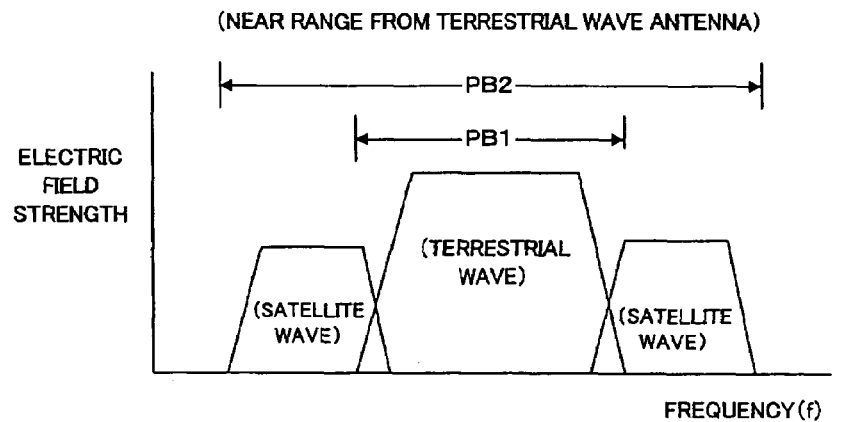
FIGS. 1A to 1C show examples of frequency band distributions for multiplex broadcasting waves of a terrestrial wave and a satellite wave.
Figure 1B:
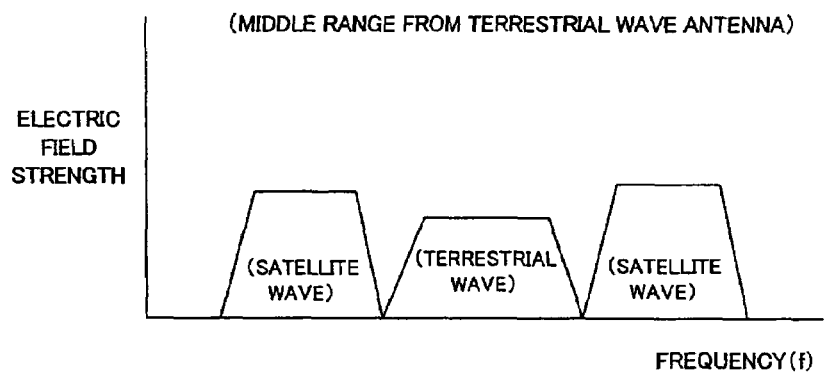
Figure 1C:
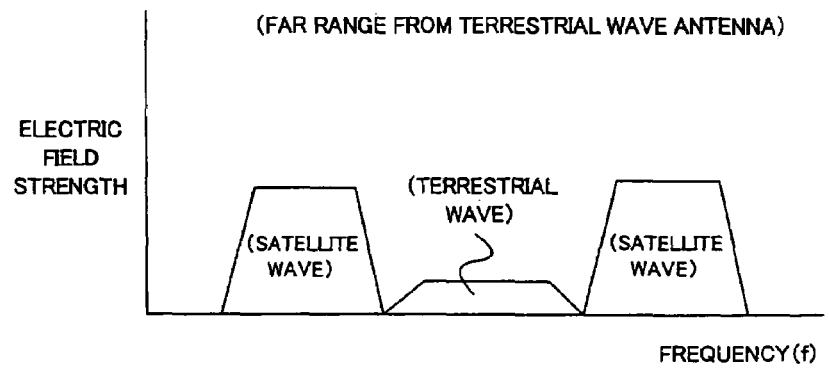

The preferred embodiments of the present invention will now be described below with reference to the attached drawings.

FIG. 2 shows a schematic configuration of a receiver 1 according to the preferred embodiment of the present invention. As shown in FIG. 2, the receiver 1 includes the first filter 2, the second filter 3, the first AGC unit 4, the second AGC unit 5, an AGC adjusting quantity determining unit 6 and an AGC adjusting unit 7.

The multiplex broadcasting waves of the first broadcasting wave and the second broadcasting wave are input into the first filter 2 and the second filter 3. The first broadcasting wave is such as the terrestrial wave for a terrestrial digital broadcasting (in short, an OFDM signal), and the second broadcasting wave is such as the satellite wave for the satellite broadcasting. The first filter 2 extracts only the first broadcasting wave from the input multiplex broadcasting waves and supplies the wave to the first AGC unit 4 as the first broadcasting wave signal. The first AGC unit 4 executes the AGC of the first broadcasting wave signal based on the first broadcasting wave signal.

On the other hand, the second filter 3 extracts both the first broadcasting wave and the second broadcasting wave, and supplies them to the second AGC unit 5 as the second broadcasting wave signal. The second AGC unit 5 executes the AGC based on the broadcasting wave signal corresponding to the first broadcasting wave and the second broadcasting wave. Thus, the AGC by the second AGC unit 5 is affected by the receiving condition of the first broadcasting wave.

The AGC adjusting quantity determining unit 6 analyzes the receiving condition of the first broadcasting wave signal, and determines the AGC adjusting quantity based on the analyzed result. The AGC adjusting unit 7 adjusts the AGC quantity by the second AGC unit 5 based on the AGC adjusting quantity which the AGC adjusting quantity determining unit 6 determines. As described above, the second AGC unit 5 executes the AGC basically based on the broadcasting wave signal including the first broadcasting wave and the second broadcasting wave. In addition, effects by the receiving condition variation of the first broadcasting wave can be reduced or eliminated by the adjustment of the AGC adjusting unit 7. As a result, the second AGC unit 5 can substantially execute an accurate AGC to the second broadcasting wave signal.

The AGC adjusting quantity determining unit 6 can include a carrier detecting unit 6a, a threshold value analyzing unit 6b and a time-variation quantity analyzing unit 6c. The carrier detecting unit 6a detects the carriers in the first broadcasting wave signal, and the detected carriers are utilized by the threshold value analyzing unit 6b and the time-variation quantity analyzing unit 6c.

The threshold value analyzing unit 6b calculates the number of the carriers larger than a predetermined threshold value. In the case that the number is larger than a predetermined number, the threshold value analyzing unit 6b determines that the receiving condition of the first broadcasting wave is stable. According to the result, the AGC adjusting quantity determining unit 6 can determine the AGC adjusting quantity and necessity of adjustment by the AGC adjusting unit 7. The threshold value analyzing unit 6b compares the carrier levels with plural threshold values to determine the receiving condition of the first broadcasting wave, such as a range relationship from the first broadcasting wave antenna to the receiver and the existence of the fading. Based on the result, the threshold analyzing unit 6b can determine the AGC adjusting quantity and the necessity of adjustment by the AGC adjusting unit 7.

On the contrary, the time-variation quantity analyzing unit 6c detects the time-variation of the receiving condition of the first broadcasting wave by analyzing a magnitude-relationship of each carrier level and the threshold value for a predetermined time period. The AGC adjusting quantity determining unit 6 can determine the AGC adjusting quantity and the necessity of adjustment by the AGC adjusting unit 7 based on the result.

Specific Embodiment

Figure 3:
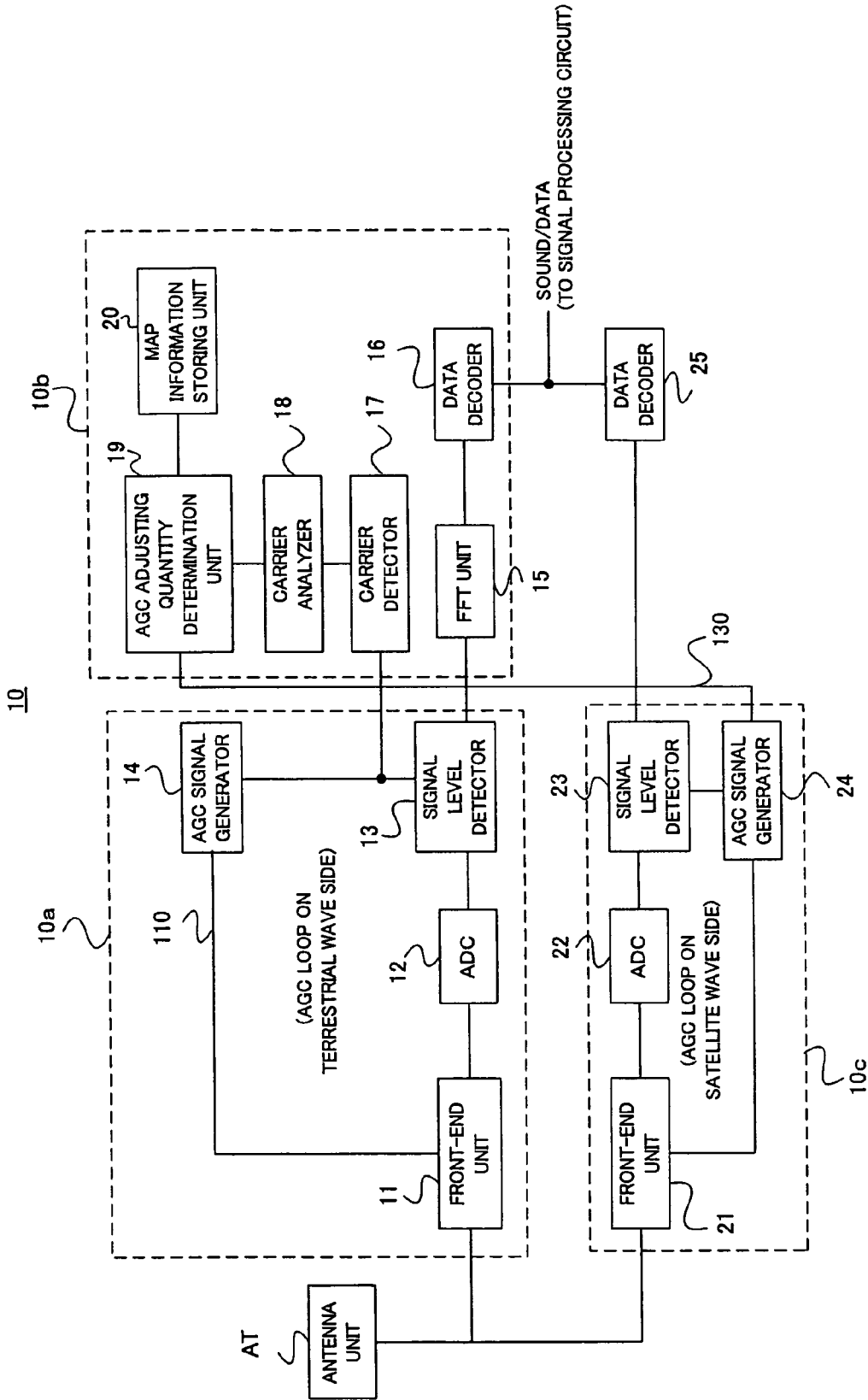
FIG. 3 is a block diagram showing a schematic configuration of the receiver according to a preferred embodiment of the present invention.

Now, a receiver according to the preferred embodiment of the present invention will be described. FIG. 3 is a block diagram showing a portion of gain control of a receiver 10 according to the preferred embodiment of the present invention. In the FIG. 3, the receiver 10 divides the received signals, which are received from an antenna unit AT, into separate systems which are for the terrestrial wave and for the satellite wave.

The receiver 10 includes a front-end unit 11, an AD converter (ADC) 12, a signal level detector 13, an AGC signal generator 14, an FFT unit 15, a data decoder 16, a carrier detector 17, a carrier analyzer 18, an AGC adjusting quantity determination unit 19 and a map information storing unit 20, as a processing system on the terrestrial wave side. The front-end unit 11, the AD converter 12, the signal level detector 13 and the AGC signal generator 14 make up an AGC loop 10a on the terrestrial wave side. The carrier detector 17, the carrier analyzer 18, the AGC adjusting quantity determination unit 19 and the map information storing unit 20 make up an AGC adjusting unit 10b.

The receiver 10 also includes a front-end unit 21, an AD converter (ADC) 22, a signal level detector 23, an AGC signal generator 24 and a data decoder 25, as a processing system on the satellite wave side. The front-end unit 21, the AD converter 22, the signal level detector 23 and the AGC signal generator 24 make up an AGC loop 10c on the satellite wave side.

First of all, the processing system on the terrestrial wave side will be explained. The antenna unit AT supplies a received wave to the front-end unit 11 as the received signal.

Figure 4:
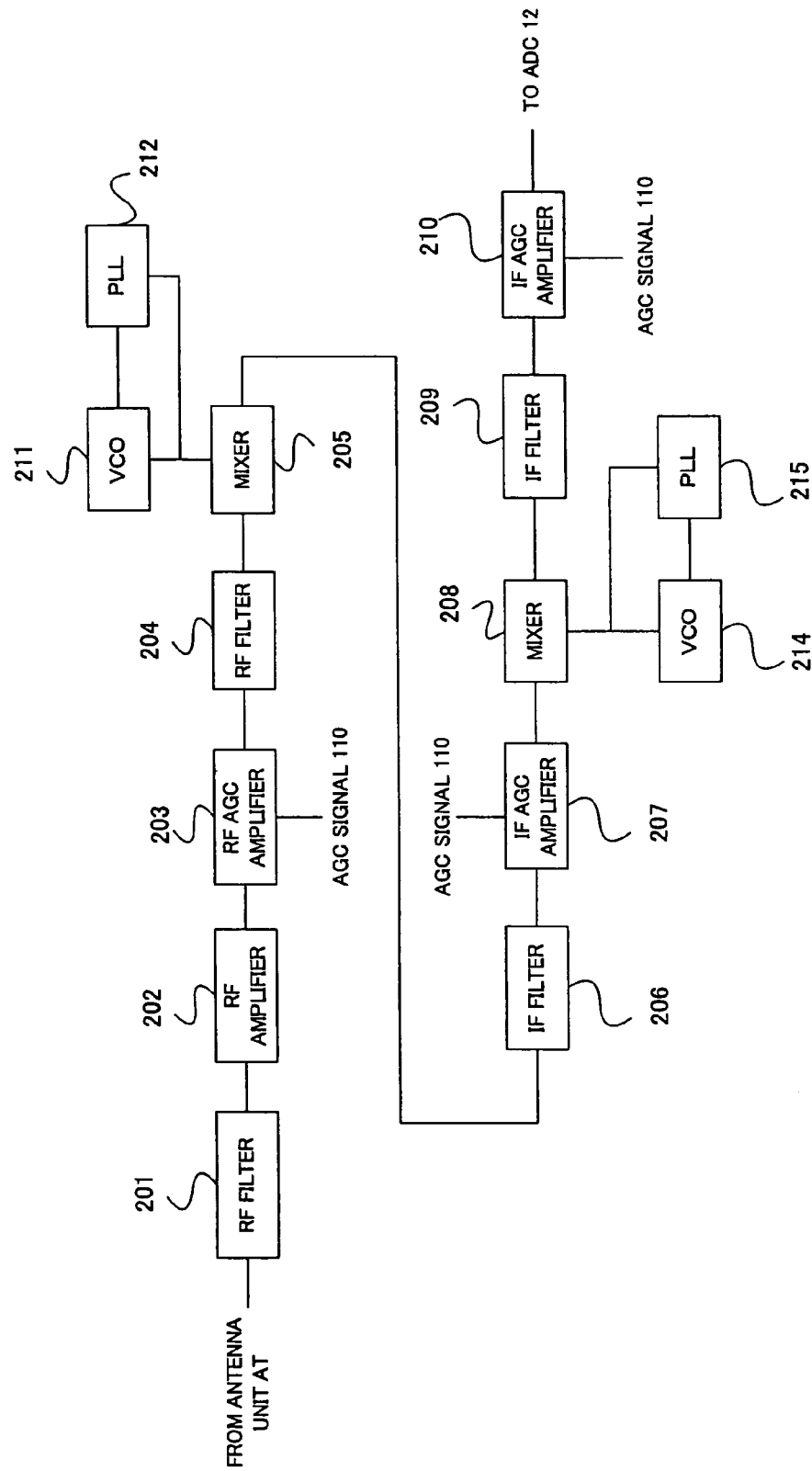
FIG. 4 is a block diagram showing a configuration of a front-end unit shown in FIG. 3.

FIG. 4 shows a configuration of the front-end unit 11. In FIG. 4, the front-end unit 11 includes an RF filter 201, an RF amplifier 202, an RF AGC amplifier 203, an RF filter 204, a mixer 205, an IF filter 206, an IF AGC amplifier 207, a mixer 208, an IF filter 209, an IF AGC amplifier 210, VCOs (Voltage Controlled Oscillator) 211 and 214, and PLLs (Phase Lock Loop) 212 and 215.

The RF filter 201 is the filter for extracting the terrestrial wave from the received signal, and has a filter pass frequency band for the terrestrial wave PB1 shown in FIG. 1A, for example. The RF amplifier 202 amplifies a terrestrial wave RF signal extracted by the RF filter 201 at the predetermined amplification degree, and supplies it to the RF AGC amplifier 203. The RF AGC amplifier 203 amplifies the terrestrial wave RF signal at the amplification degree corresponding to the AGC signal 110 supplied from the AGC signal generator 14. The amplified terrestrial wave RF signal is filtered by the RF filter 204 having the identical passing characteristic with the RF filter 201, and is supplied to the mixer 205.

The mixer 205 generates the first IF (Intermediate Frequency) signal by mixing the signal generated by the PLL 212 and the VCO 211 with the signal output from the RF filter 204, and supplies the signal to the IF filter 206. The IF AGC amplifier 207 amplifies the first IF signal based on the AGC signal 110 obtained from the AGC signal generator 14. The mixer 208 generates the second IF signal by mixing the signal generated by the VCO 214 and the PLL 215 with the first IF signal, and supplies the signal to the IF filter 209. The IF filter 209 filters the second IF signal by the second IF and supplies the signal to the IF AGC amplifier 210. The IF AGC amplifier 210 amplifies the second IF signal based on the AGC signal 110 supplied from the AGC signal generator 14, and outputs the signal to the AD converter 12.

In the front-end unit 11 shown in FIG. 4, the gain control is executed respectively by the AGC amplifier 203, 207 and 210 in three stages, i.e., the RF signal, the first IF signal and the second IF signal. It is noted that the AGC signal generator 14 supplies different AGC signals 110 to the respective AGC amplifiers 203, 207 and 210, and the respective signals can be amplified at the different amplification factors by the respective amplifiers.

The AD converter 12 converts an analog IF signal to a digital signal, and supplies the digital signal to the signal level detector 13. The signal level detector 13 calculates an average power value as the level of the digital IF signal. The average power value is utilized as a parameter for determining whether electric field strength of the terrestrial wave signal is high enough or not.

Figure 5A:
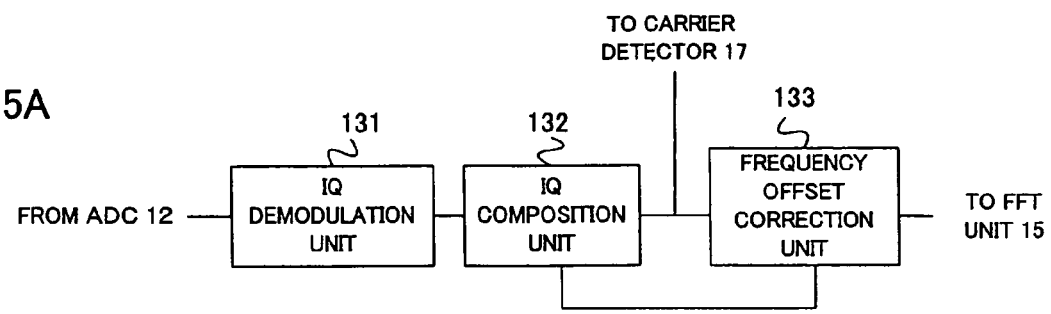
FIGS. 5A and 5B are block diagrams each showing a configuration of a signal level detector shown in FIG. 3.

FIG. 5A shows a configuration example of the signal level detector 13. The configuration example is in the case that the terrestrial wave signal is the OFDM signal. An IQ demodulation unit 131 separates real number components and imaginary number components from the digital IF signal output from the AD converter 12. An IQ composition unit 132 composes both of the components, and a frequency offset correction unit 133 executes offset-correction on the frequency axis. Thereby, the obtained signal is supplied to the carrier detector 17 and the FFT (Fast Fourier Transform) unit 15. The FFT unit 15 executes FFT-processing of the signal from the signal level detector 13 and supplies the signal to the data decoder 16. The data decoder 16 decodes sound/data in the terrestrial wave signal and supplies the signal to a signal processing circuit.

Next, the processing system on the satellite wave side will be explained. The received signal from the antenna unit AT is input to the front-end unit 21. The front-end unit 21 basically has the identical configuration with the front-end unit 11 shown in FIG. 4, down-converts the satellite wave RF signal to the first and the second IF signal and outputs to the AD converter 22. However, the RF filter in the front-end unit 21 on the satellite wave side includes the passing characteristic PB2 which passes through all frequency bands of the satellite wave and the terrestrial wave as shown in FIG. 1A. As a result, the AGC loop 10c on the satellite wave side executes the AGC based on the signal in the frequency band including the satellite wave and the terrestrial wave.

But, in the present invention, it is characterized that the AGC adjusting quantity determination unit 10b adjusts the AGC signal of the AGC loop 10c on the satellite wave side based on the detecting signal of the terrestrial wave as shown in FIG. 3.

Figure 5B:
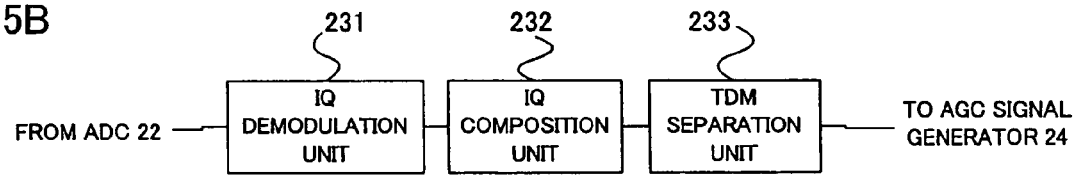

The output signal from the front-end unit 21 is converted to the digital signal by the AD converter 22, and is supplied to the signal level detector 23. FIG. 5B shows a configuration example of the signal level detector 23. In the signal level detector 23, the IQ demodulation unit 231 separates the input satellite wave signal into the real number components and the imaginary number components, and the IQ composition unit 232 composes both of them. A TDM separation unit 233 separates the composed signal, on time-basis, to obtain the satellite wave signal and transmits it to the data decoder 25. The data decoder 25 decodes the satellite signal to obtain the sound/data and supplies it to the signal processing circuit.

Next, the AGC adjusting unit 10b will be explained. The AGC adjusting unit 10b executes a process of determining the AGC signal adjusting quantity of the AGC loop 10c on the satellite wave side based on the terrestrial wave signal output from the signal level detector 13. Specifically, the carrier detector 17 frequency-analyzes the terrestrial wave signal output from the signal level detector 13, and detects the carrier included in the terrestrial wave signal. The carrier analyzer 18 analyzes the receiving condition of the terrestrial wave signal based on the detected carrier, and sends the analyzed result to the AGC adjusting quantity determination unit 19. The analyzed results of the terrestrial wave signal may be the number of carriers in the terrestrial wave signal larger than the predetermined level, the receiving condition of the terrestrial wave signal and the temporal time-variation quantity of the receiving condition. The map information storing unit 20 stores correspondence between those analyzed results of the terrestrial wave signal and the AGC adjusting quantities corresponding to those results, as map information. The AGC adjusting quantity determination unit 19 determines the AGC adjusting quantity by referring to the map information based on the analyzed result of the terrestrial wave signal supplied from the carrier analyzer 18, and supplies it to the AGC signal generator 24 in the AGC loop 10c on the satellite wave side as the AGC adjusting quantity signal 130. In the AGC loop on the satellite wave side, the AGC signal is adjusted based on the AGC adjusting quantity signal 130. Thereby, the AGC correction can be executed in the AGC loop 10c on the satellite wave side by considering the received condition of the terrestrial wave signal. Only by the AGC loop on the satellite side, the AGC is executed by extracting the signal in the frequency band including the terrestrial wave and the satellite wave as described above, and therefore the AGC itself is easily affected by the receiving condition of the terrestrial wave signal. In that point, according to the embodiment, since the AGC adjusting unit 10b adjusts the AGC quantity in the AGC loop 10c on the satellite wave side in accordance with the result obtained by detecting and analyzing the receiving condition of the terrestrial wave signal, the effects on the AGC loop 10c on the satellite wave side caused by the receiving condition of the terrestrial wave signal can be reduced. As a result, it is possible that the appropriate AGC for obtaining the satellite wave signal is executed in the AGC loop 10c on the satellite wave side.

Next, a process in the AGC adjusting unit 10b will be explained in detail. The AGC adjusting unit 10b produces the analyzed results of some parameters indicating the receiving condition of the terrestrial wave signal by analyzing the terrestrial wave signal.

Figure 6A:
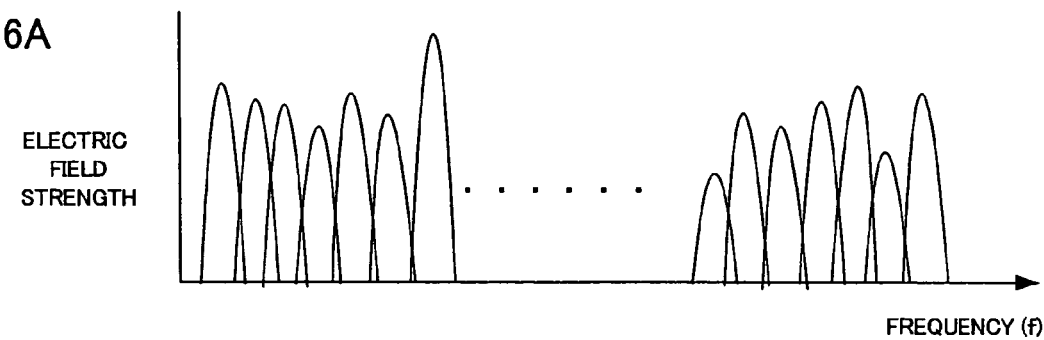
FIGS. 6A and 6B show examples of frequency distributions for carriers of a terrestrial wave signal (OFDM signal).
Figure 6B:
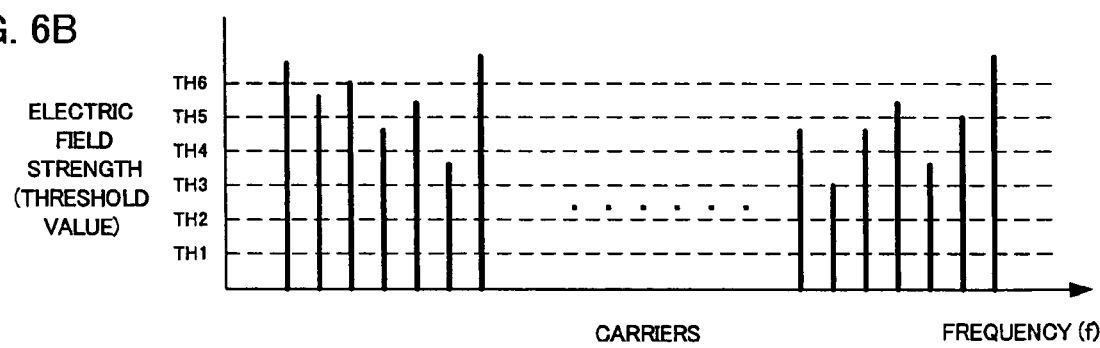

FIGS. 6A and 6B show frequency distribution of the carriers forming the terrestrial wave signal (OFDM signal). Though the number of carriers in the OFDM signal is different dependently on the system, it is assumed that the OFDM signal has carries of fixed-number (1024 pieces) in the embodiment. The carrier detector 17 detects the carriers by frequency-analyzing the terrestrial wave signal extracted from the signal level detector 13. FIG. 6B shows an example of the detecting result of carriers. Since 1024 carriers are located at even intervals on the frequency axis in the OFDM signal, the signal level for each carrier can be detected by analyzing each carrier.

Next, the carrier analyzer 18 compares the level of each of detected carriers with the predetermined threshold value, and calculates the number of carriers having the level larger than the threshold value. The number of carrier is utilized as a parameter indicating whether the receiving condition of the terrestrial wave signal is stable or unstable. Namely, the carrier analyzer 18 evaluates each carrier level by a certain threshold value, and it is determined that the terrestrial wave signal is received stably if the number of carriers having the level larger than the threshold value is larger than the predetermined number. On the other hand, it is determined that the receiving condition of the terrestrial wave signal is unstable if the number of carriers having the level larger than the threshold value is smaller than the predetermined number.

Further, the carrier analyzer 18 sets the threshold values in plural electric field strengths, and detects the number of carriers respectively having the level larger than the predetermined threshold value. By the analysis (threshold value analysis), it can be schematically grasped what the current receiving condition of the terrestrial wave signal is like. FIGS. 7A to 7D show rates of the number of carriers having the level larger than plural threshold value when the terrestrial wave signals are in various conditions. It is noted that the threshold value indicated on the horizontal axis corresponds to the level of the electric field strength shown in FIG. 6B.

Figure 7A:
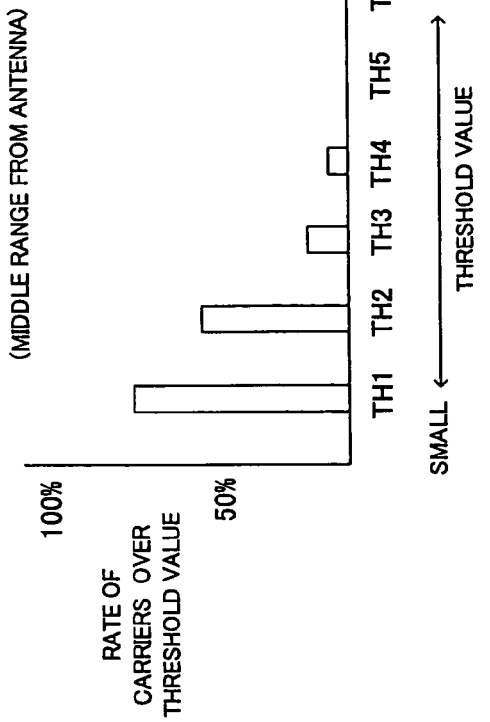
FIGS. 7A to 7D show examples of threshold value analyses for carriers for a terrestrial wave signal.

FIG. 7A shows the result of the threshold value analysis in the case that the receiver 10 is in the near range from the terrestrial wave antenna. Since the receiver 10 is in the near range from the terrestrial wave antenna, the rate of the number of carriers larger than the threshold value is high at any threshold value.

Figure 7B:
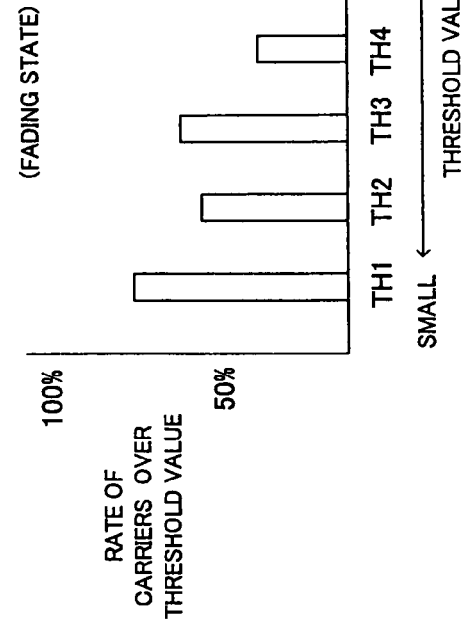

FIG. 7B shows the result of the threshold value analysis in the case that the receiver is in the middle range from the terrestrial wave antenna. Since the level of received terrestrial wave is reduced slightly apart from the terrestrial wave antenna, the rate of the number of carriers having level larger than the high threshold value such as TH5 and TH6 is reduced.

Figure 7C:
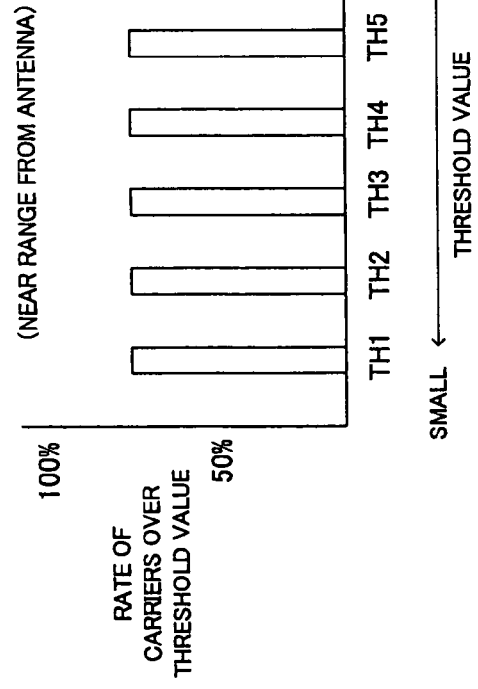

FIG. 7C shows the result of the threshold value analysis in the case that the receiver is in the far range from the terrestrial wave antenna. A few carriers larger than the minimum threshold value are detected because the level of the received terrestrial wave in the far range from the terrestrial wave antenna is remarkably reduced.

Figure 7D:
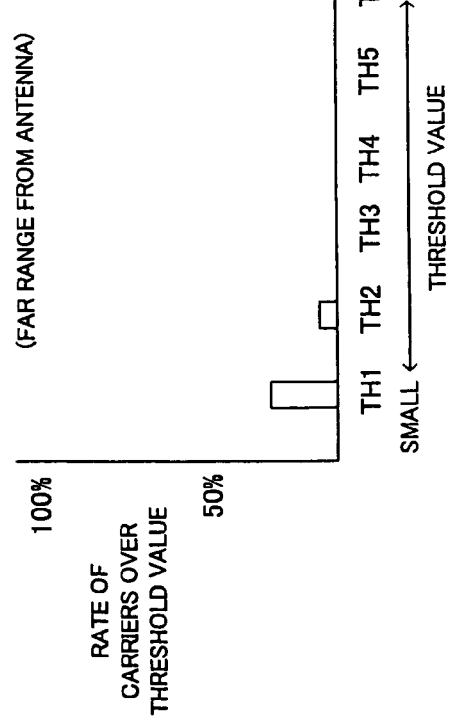

FIG. 7D shows the condition of the received terrestrial wave affected by the fading. Since the level of each carrier is irregularly varied, the rate of the number of carriers larger than each threshold value is irregular regardless of the magnitude of the threshold value. As for the example in FIG. 7D, since the rate of the number of carriers larger than the threshold value TH4 is smaller than any other rate, and there is a difference between the rate of the number of carriers larger than the threshold values TH3 and TH4. As a result, it is presumable that the received signal of the terrestrial wave has a large variation at the level around the threshold value TH3 and TH4.

Figure 8B:
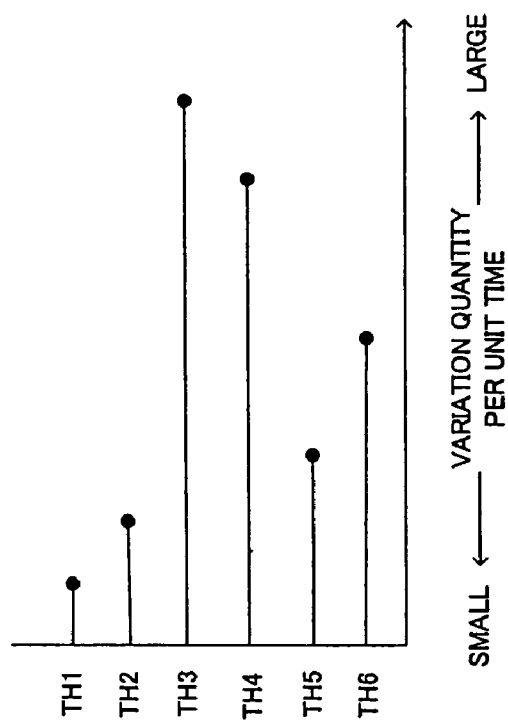
FIGS. 8A and 8B show examples of time-variation analyses for carriers of a terrestrial wave signal.
Figure 8A:
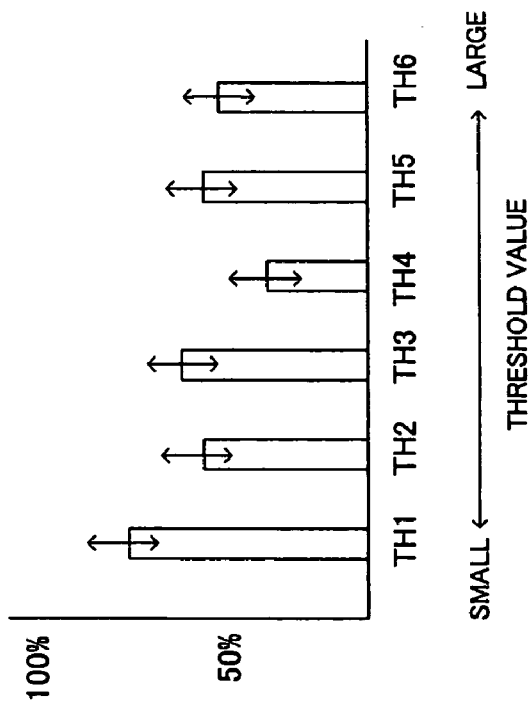

The carrier analyzer 18 executes time-variation quantity analysis of the receiving condition. The time-variation quantity analysis is to analyze the receiving condition for a predetermined period. FIGS. 8A and 8B show an example of the time-variation quantity analysis. In this example, as shown in FIG. 8A, the number of carriers having the level larger than the plural threshold values (TH1 to TH6) during the predetermined unit time is calculated, and based on the result, the magnitudes of the carrier number variations at each of the threshold values TH1 to TH6 are analyzed as shown in FIG. 8B. As shown in FIG. 8B, if the variation quantity of the number of carriers having the level larger than each threshold value is examined per unit time, it is presumable which level the terrestrial wave signal has a large temporal variation on. Since the variation quantity at the threshold level TH3 is large in the example in FIG. 8B, it is understood that a large number of carriers have level variations at the level around the threshold value TH3.

AGC Operation

Figure 9:
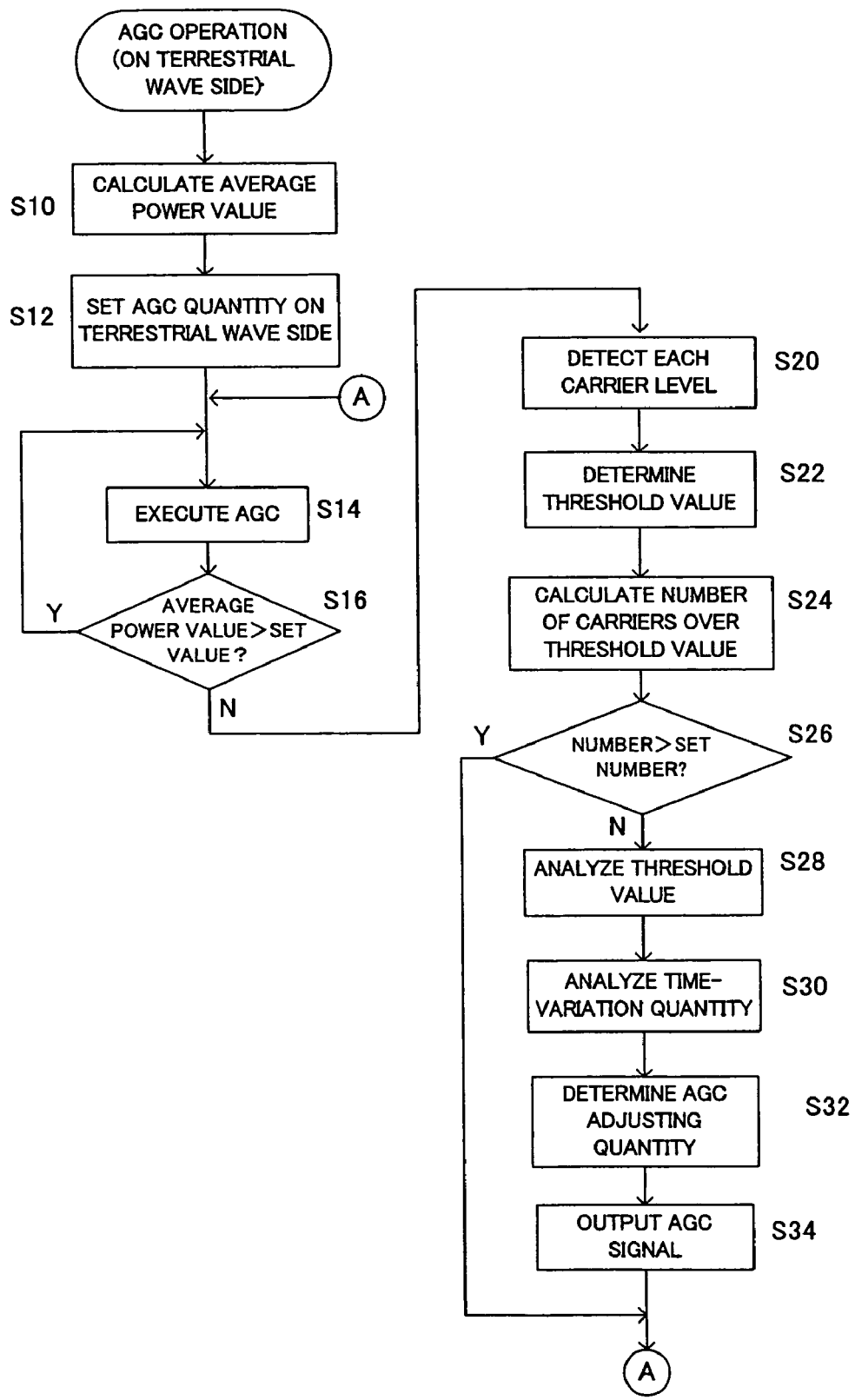
FIG. 9 is a flow chart of an AGC operation on a terrestrial wave side.

Next, an AGC operation of the receiver according to the embodiment will be explained. The receiver 10 includes the AGC loops on both of the terrestrial wave side and the satellite wave side as shown in FIG. 3. First of all, the AGC operation by the AGC loop 10*a* on the terrestrial wave side will be described. FIG. 9 is a flow chart showing the AGC operation on the terrestrial wave side.

First, the signal level detector 13 extracts the terrestrial wave signal and calculates the average power value (step S10). The AGC signal generator 14 determines the AGC quantity on the terrestrial wave side based on the calculated average power value, and supplies the AGC quantity signals 110 to each of AGC amplifiers in the front-end unit 11. Thereby, the AGC amplifiers respectively set amplification degree of the RF signal and the IF signal, and amplify the signals. In that way, the basic AGC is executed in the AGC loop 10*a* on the terrestrial wave side (step S14).

Next, it is determined whether the average power value calculated in step S10 is larger than the predetermined set value or not (step S16). The set value is set in order to determine whether the average power level in the whole terrestrial wave signal is at a sufficient level or not. If the average power value is larger than the set value (step S16; Yes), the AGC in step S14 is carried on.

On the contrary, if the average power value is smaller than the set value (step S16; No), the AGC adjusting unit 10*b* operates. Namely, the carrier detector 17 detects the level of each carrier in the terrestrial wave signal (step S20). Then, the carrier analyzer 18 determines the predetermined threshold value (step S22), and calculates the number of carriers larger than the predetermined threshold value (step S24).

In the case that the number of carriers larger than the predetermined threshold value is larger than the predetermined set number (step S26), the process returns to step S14 and the AGC is continued. On the contrary, in the case that the number of carriers larger than the predetermined threshold value is smaller than the set number (step S26; No), the carrier analyzer 18 executes the threshold value analysis (step S28), and also executes the time-variation quantity analysis (step S30). Based on the result, the AGC adjusting quantity determination unit 19 determines the AGC adjusting quantity (step S32) by referring to the map information, and supplies it to the AGC signal generator 24 in the AGC loop 10*c* on the satellite wave side shown in FIG. 3 as the AGC adjusting quantity signal 130 (step S34).

Figure 10:
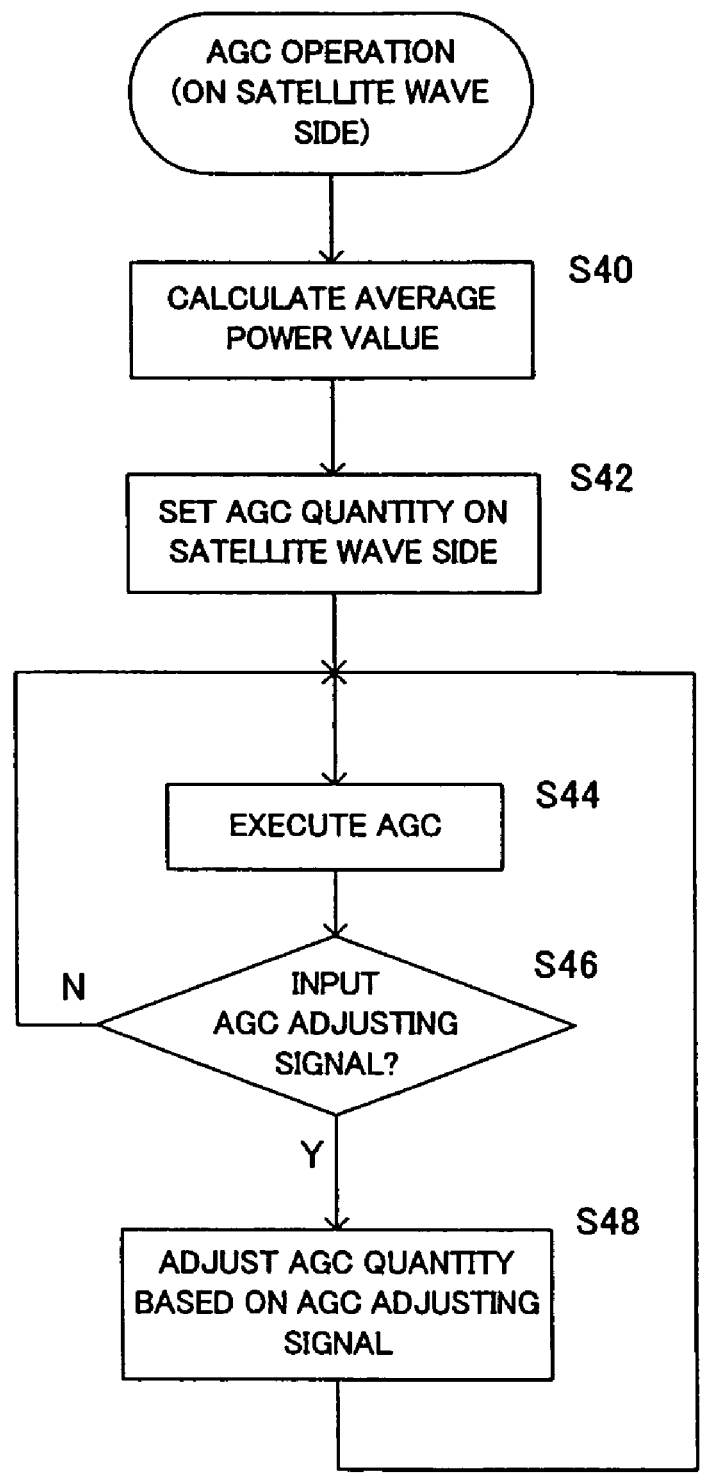
FIG. 10 is a flow chart of an AGC operation on a satellite wave side.

Next, the AGC operation on the satellite wave side will be explained with reference to FIG. 10. FIG. 10 is a flow chart of the AGC operation on the satellite wave side. In FIG. 10, the signal level detector 23 calculates the average power value of the signal on the satellite wave side (step S40). The AGC signal generator 24 sets the AGC quantity on the satellite wave side based on the calculated average power value (step S42). Then, the AGC signal generator 24 supplies the AGC signal to the plural AGC amplifiers in the front-end unit 21, and thus the AGC is executed (step S44).

The AGC signal generator 24 determines whether the AGC adjusting signal 130 is input from the AGC adjusting quantity determination unit 19 in the AGC adjusting unit 10*b* or not (step S46). In the case that the AGC adjusting signal 130 is not input (step S46; No), the process returns to the step S44, and the AGC is continued.

On the other hand, in the case that the AGC adjusting signal 130 is input (step S46; Yes), the AGC signal generator 24 adjusts the AGC quantity on the satellite wave side based on the AGC adjusting signal 130 (step S48). Accordingly, the AGC quantity on the satellite wave side is adjusted in accordance with the receiving condition of the terrestrial wave signal.

An adjusting method of the AGC quantity on the satellite wave side can be as suggested below. For example, in the case that the average power of the terrestrial wave signal is large, it is determined that the receiving condition of the terrestrial wave signal is relatively stable and the effect which the terrestrial wave signal gives the AGC on the satellite wave side is not so large. As a result, the correction can be suspended or the correction quantity can be set small. On the contrary, in the case that the average power of the terrestrial wave signal is small and additionally that the time-variation quantity is large, it is determined that the variation of the terrestrial wave signal is large. As a result, the AGC correction quantity on the satellite wave side can be set large. Further, if it is determined that the receiving condition of the terrestrial wave signal is affected by the fading according to the threshold value analysis, the AGC quantity on the satellite wave side can be increased within the limit of no distortion.

Modification

In the above embodiment, though only the AGC quantity on the satellite wave side is adjusted based on the analyzed result of the receiving condition of the terrestrial wave, it is possible that the AGC quantity on the terrestrial wave side is also adjusted by utilizing the analyzed result. Since the AGC loop on the terrestrial wave side basically executes the AGC based on the level (average power value) of the terrestrial wave signal, the AGC on the terrestrial wave side can be more precisely executed if the adjustment of the AGC loop 10*a* on the terrestrial wave side is performed based on the result of the precise frequency analysis of the terrestrial wave signal executed by the AGC adjusting unit 10*b*.

Moreover, though the terrestrial wave is the OFDM signal and the satellite wave is the TDM signal in the above embodiment, the present invention can be applied if any one of plural multiplex broadcasting waves is the OFDM signal. Namely, the present invention can be applied to various cases that the AGC adjustment of other signal is executed by utilizing the frequency analysis result of the receiving condition of the OFDM signal.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2002-243565 filed on Aug. 23, 2002 including the specification, claims, drawings and summary is incorporated herein by reference in its entirety.

What is claimed is:

1. A receiver comprising:
a receiving unit which receives a multiplex wave of a first broadcasting wave and a second broadcasting wave and outputs a received signal;
a first filter which extracts only the first broadcasting wave from the received signal and outputs a first broadcasting wave signal;
a second filter which extracts the first broadcasting wave and the second broadcasting wave from the received signal and outputs a second broadcasting wave signal;
a first AGC unit which receives a signal indicative of a level of the first broadcasting wave signal and controls a gain of the first broadcasting wave signal based on the level of the first broadcasting wave signal;
a second AGC unit which receives a signal indicative of a level of the second broadcasting wave signal and controls a gain of the second broadcasting wave signal based on the level of the second broadcasting wave signal;
an AGC adjusting quantity determining unit which analyzes a receiving condition of the first broadcasting wave signal and determines an AGC adjusting quantity based on an analyzed result; and
an AGC adjusting unit which adjusts an AGC quantity of the second AGC unit according to the AGC adjusting quantity.

2. The receiver according to claim 1, wherein the AGC adjusting quantity determining unit comprises:
a carrier detecting unit which detects carriers of the first broadcasting wave signal;
a threshold value analyzing unit which determines the receiving condition of the first broadcasting wave signal by comparing detected carriers with a predetermined threshold value; and
a unit which determines the AGC adjusting quantity based on a determining result by the threshold value analyzing unit.

3. The receiver according to claim 1, wherein the threshold value analyzing unit comprises:
a unit which compares the detected carriers with the predetermined threshold value;
a unit which compares a number of carriers having a level larger than the predetermined threshold value with a predetermined number; and
a unit which executes an adjustment by the AGC adjusting unit in a case that the number of carriers having the level larger than the predetermined threshold value is smaller than the predetermined number.

4. The receiver according to claim 2, wherein the receiving condition of the broadcasting wave signal comprises a condition associated with a range of the receiver from a broadcasting antenna for the first broadcasting wave signal and a condition of a fading.

5. The receiver according to claim 1, wherein the AGC adjusting quantity determining unit comprises:
a carrier detecting unit which detects carriers of the first broadcasting wave signal;
a time-variation quantity analyzing unit which outputs a time-variation quantity indicating a level variation of the carriers during a predetermined time; and
a unit which determines the AGC adjusting quantity in accordance with the time-variation quantity.

6. An AGC method comprising:
a process of receiving a multiplex wave of a first broadcasting wave and a second broadcasting wave and outputting a received signal;
a process of extracting only the first broadcasting wave from the received signal and outputting a first broadcasting wave signal;
a process of extracting the first broadcasting wave and the second broadcasting wave from the received signal and outputting a second broadcasting wave signal;
a first AGC process of receiving a signal indicative of a level of the first broadcasting wave signal and controlling a gain of the first broadcasting wave signal based on the level of the first broadcasting wave signal;
a second AGC process of receiving a signal indicative of a level of the second broadcasting wave signal and controlling a gain of the second broadcasting wave signal based on the level of the second broadcasting wave signal;
an AGC adjusting quantity determining process of analyzing a receiving condition of the first broadcasting wave signal and determining an AGC adjusting quantity based on an analyzed result; and
an AGC adjusting process of adjusting an AGC quantity utilized in the second AGC process according to the AGC adjusting quantity.

* * * * *